United States Patent
Beckmann et al.

(10) Patent No.: US 10,761,164 B2
(45) Date of Patent: Sep. 1, 2020

(54) GENERATING A SPATIALLY RESOLVED MAGNETIC RESONANCE DATASET

(71) Applicants: Marc Beckmann, Bubenreuth (DE); Petra Bildhauer, Nürnberg (DE); Carsten Großhauser, Erlangen (DE); Hubertus Fischer, Bamberg (DE); Uvo Hölscher, Erlangen (DE); Ralf Kartäusch, Erlangen (DE); Jürgen Nistler, Erlangen (DE); Dominik Paul, Bubenreuth (DE); Dieter Ritter, Fürth (DE); Volker Weißenberger, Möhrendorf (DE)

(72) Inventors: Marc Beckmann, Bubenreuth (DE); Petra Bildhauer, Nürnberg (DE); Carsten Großhauser, Erlangen (DE); Hubertus Fischer, Bamberg (DE); Uvo Hölscher, Erlangen (DE); Ralf Kartäusch, Erlangen (DE); Jürgen Nistler, Erlangen (DE); Dominik Paul, Bubenreuth (DE); Dieter Ritter, Fürth (DE); Volker Weißenberger, Möhrendorf (DE)

(73) Assignee: Siemens Healthcare GmbH, Erlangen (DE)

( * ) Notice: Subject to any disclaimer, the term of this patent is extended or adjusted under 35 U.S.C. 154(b) by 186 days.

(21) Appl. No.: 15/965,919

(22) Filed: Apr. 28, 2018

(65) Prior Publication Data
US 2018/0313922 A1    Nov. 1, 2018

(30) Foreign Application Priority Data

Apr. 28, 2017  (DE) .................. 10 2017 207 267

(51) Int. Cl.
*G01R 33/44* (2006.01)
*G01R 33/36* (2006.01)
(Continued)

(52) U.S. Cl.
CPC ..... *G01R 33/443* (2013.01); *G01R 33/34046* (2013.01); *G01R 33/3621* (2013.01);
(Continued)

(58) Field of Classification Search
CPC ............. G01R 33/443; G01R 33/3621; G01R 33/34046; G01R 33/5608; G01R 33/5659; G01R 33/246
See application file for complete search history.

(56) References Cited

U.S. PATENT DOCUMENTS 5,001,428 A * 3/1991 Maier .................. G01R 33/246
 324/309
6,949,928 B2 * 9/2005 Gonzalez Ballester ....................
 G01R 33/3415
 324/307
(Continued)

FOREIGN PATENT DOCUMENTS

DE     102014223734 A1    5/2016
DE     102015203306 A1    8/2016

OTHER PUBLICATIONS

Adam C. Zelinski et al: "Fast Slice—Selective Radio—Frequency Excitation Pulses for Mitigating B1+ Inhomogeneity in the Human Brain at 7 Tesla", Magnetic Resonance in Medicine vol. 59, pp. 1355-1364, 2008.
(Continued)

*Primary Examiner* — Dixomara Vargas
(74) *Attorney, Agent, or Firm* — Lempia Summerfield Katz LLC

(57) ABSTRACT

A method for generating a spatially resolved magnetic resonance dataset using a coil arrangement includes provid-
(Continued)

ing at least one correction datum based on receiver characteristics of the coil arrangement. The method also includes providing a magnetic resonance dataset with spatially resolved signal intensity data, and correcting the at least one signal intensity datum in the magnetic resonance dataset by the correction datum before or after providing the magnetic resonance dataset.

17 Claims, 8 Drawing Sheets

(51) Int. Cl.
    *G01R 33/34* (2006.01)
    *G01R 33/56* (2006.01)
    *G01R 33/565* (2006.01)
    *G01R 33/24* (2006.01)

(52) U.S. Cl.
    CPC ..... *G01R 33/5608* (2013.01); *G01R 33/5659* (2013.01); *G01R 33/246* (2013.01)

(56) References Cited

U.S. PATENT DOCUMENTS

| | | | | |
|---|---|---|---|---|
| 8,077,955 B2* | 12/2011 | Dannels | ............... | G01R 33/246 324/309 |
| 8,217,652 B2* | 7/2012 | Dannels | ............. | G01R 33/5659 324/309 |
| 8,502,538 B2* | 8/2013 | Dannels | ............... | G01R 33/243 324/307 |
| 8,810,242 B2* | 8/2014 | Dannels | ............. | G01R 33/5659 324/307 |
| 9,146,293 B2* | 9/2015 | Wang | ..................... | G01R 35/00 |
| RE47,026 E * | 9/2018 | Vaughan | .............. | G01R 33/583 |
| 10,247,802 B2* | 4/2019 | Wang | .................. | G01R 33/246 |
| 2004/0070394 A1* | 4/2004 | Gonzalez Ballester | | G01R 33/3415 324/307 |
| 2008/0129298 A1* | 6/2008 | Vaughan | ............ | G01R 33/5612 324/322 |
| 2010/0239142 A1* | 9/2010 | Dannels | ............... | G01R 33/246 382/131 |
| 2010/0239151 A1* | 9/2010 | Dannels | ............... | G01R 33/243 382/131 |
| 2012/0032676 A1* | 2/2012 | Dannels | ............... | G01R 33/246 324/309 |
| 2012/0032677 A1* | 2/2012 | Dannels | ............. | G01R 33/5659 324/309 |
| 2013/0021033 A1 | 1/2013 | Stoeckel et al. | | |
| 2013/0165768 A1 | 6/2013 | Biber | | |
| 2013/0229176 A1 | 9/2013 | Fautz | | |
| 2015/0241537 A1* | 8/2015 | Dannels | ........... | G01R 33/56554 324/309 |
| 2015/0309147 A1* | 10/2015 | Schmitter | ............ | G01R 33/543 600/410 |
| 2016/0018502 A1* | 1/2016 | Wang | ................... | G01R 33/246 324/307 |
| 2016/0146908 A1 | 5/2016 | Khler | | |
| 2016/0245882 A1 | 8/2016 | Popescu | | |
| 2016/0310761 A1* | 10/2016 | Li | ........................ | A61N 5/1038 |

OTHER PUBLICATIONS

German Office Action for German Application No. 10 2017 207 267.9 dated Jan. 18, 2019.

* cited by examiner

GENERATING A SPATIALLY RESOLVED MAGNETIC RESONANCE DATASET

This application claims the benefit of DE 10 2017 207 267.9, filed on Apr. 28, 2017, which is hereby incorporated by reference in its entirety.

BACKGROUND

The present embodiments relate to generating a spatially resolved magnetic resonance dataset using a coil arrangement.

When recording magnetic resonance data, one or a plurality of coils are used as transmission and receiving devices. In the case of transmission, a B1 field is emitted.

In connection with MR measurements, B1 radiofrequency fields or B1 fields are also known as high frequency pulses or HF pulses. These are used to deflect the magnetization of the examination object from the resting position by a desired flip angle. For this purpose, one or a plurality of transmission coils is/are supplied with current.

The flip angle achieved is dependent on the duration of the HF pulse and on the pulse profile. An interaction exists here between the B1 field of the high frequency pulse and the tissue that is being examined. As a result of this, the magnetization is deflected.

Even when the same coil is used for transmission and receiving, different B1 fields may be present due to different connections for transmission and receiving. When transmitting, the $B_1^+$ field is present, and when receiving, the $B_1^-$ field is present.

The distribution of the B1 field of a high frequency pulse may be shown by a $B_1$ map. This may be created for each of the fields (e.g., for the $B_1^+$ field and the $B_1^-$ field).

The use, as a point of departure, of $B_1^+$ maps (e.g., $B_1$ maps) is known for homogenizing high frequency pulses such that the distribution of the $B_1^+$ field is as homogeneous as possible in the case of transmission.

Despite these correction measures, in breast imaging, for example, artifacts often occur. For example, there may be differences in brightness in the image within breasts of a subject or between the two breasts, which occur, for example, in the form of eddy currents induced in the tissues that have been recorded. Ultimately, the signal intensities shown in the images do not correspond with the distribution in the tissue.

Methods for B1 shimming are known from US 2013/0165768, US 2013/0229176 A1, and US 2013/0021033 A1.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a method, a magnetic resonance device, and a data carrier that stores the method with which such artifacts may be avoided or at least reduced are provided.

A method for operating a magnetic resonance system includes providing at least one correction datum based on receiver characteristics of the coil arrangement. A magnetic resonance dataset is provided with spatially resolved signal intensity data. At least one signal intensity datum of the magnetic resonance dataset is corrected by at least one correction datum before or after providing the magnetic resonance dataset.

The receiving field $B_1^-$ of the receiver coil arrangement is taken into account in data acquisition or data processing. Usually, the transmission field $B_1^+$ is homogenized. In other words, an attempt is made to render the transmission field and hence the flip angle homogeneous in the entire sample.

In the patient, eddy currents occur due to the tissue in the examination region. These currents lead to a phase shift to the inducing current. As a result thereof, in the case of receiving, a location-dependent flip angle is generated. Accordingly, this leads to location-dependent signal intensities that make diagnosis more difficult.

These signal losses may be avoided or corrected by taking into account the receiver characteristics of the coil arrangement (e.g., the $B_1$ field distribution of the receiver coil arrangement). By taking into account the receiver characteristics, homogenization not of the transmission field but of the signal intensity data may be achieved. This provides that two signal intensities are then equal if the same signal is emitted in the relevant voxels of the examination region without artifacts. Since signal intensities may differ due to many factors, such as relaxation times, etc., no kinds of differences in signal intensities occur due to the $B_1^-$ sensitivity of the measuring arrangement. In a water phantom, all the pixels or voxels then have the same signal intensity. Differences may only occur at the edge of the phantom, where the recorded volumes are only partly filled.

The measured data may be used to generate any location-dependent signal information. For example, it may be a case of measured data relating to a localized spectrum, to a chemical shift image (a CSI), or to an image dataset. In each case, this data may be embodied two-dimensionally or three-dimensionally.

The correction datum or the correction data then serves to compensate for any location-dependent signal losses due to a location-dependent sensitivity of the receiver coil or receiver coils. A datum is the singular form of data. This compensation may be carried out before or after the measurement.

The correction datum or the correction data may basically be measured or calculated.

In one embodiment, to acquire the at least one correction datum, at least one unit of $B_1^-$ receiving information relating to the coil arrangement may be measured. A unit of $B_1^-$ receiving information is, for example, a $B_1^-$-related estimated value.

To determine the at least one correction datum, at least one $B_1^-$ receiving map of the coil arrangement may be determined. The $B_1^-$ receiving map may also be known as a $B_1^-$ map. This map shows the sensitivity distribution of the coil arrangement in the case of receiving. It may be deduced from this whether and where a correction of the measured data is necessary.

A determination of a $B_1^-$ map may ensue, for example, such that the examination region is first measured using a coil arrangement that has a homogeneous or known $B_1^-$ field. This may involve a body coil, for example. A measurement may subsequently be made using the coil arrangement that is to be determined. In both cases, the same transmission coil arrangement is used for excitation. If the fractional intensity distributions of the coils are divided up, then the object-dependent intensity is no longer included, and the result is now dependent only on the $B_1^-$ field of the coils. For a homogeneous reference coil arrangement such as the body coil, the course of the $B_1^-$ field is now only dependent on the coil arrangement that is to be determined.

Alternatively, according to the reciprocity theorem, it may be concluded from the transmission map $B_1^+$ that the receiver profile is $B_1^-$. Effects such as different coupling factors may be taken into account using correction values.

In one embodiment, at least one unit of $B_1^+$ transmission information relating to the coil arrangement may be acquired in order to acquire the at least one correction datum. A unit of $B_1^+$ transmission information is, for example, a $B_1^+$-related measured value.

In order to acquire the at least one correction datum, at least one $B_1^+$ transmission map may be recorded. The $B_1^+$ transmission map may also be known as a $B_1^+$ map. This map shows the sensitivity distribution of the coil arrangement when transmitting. From this too, it may be deduced whether and where a correction of the measured data is to be provided.

As disclosed in the aforementioned, the correction of the signal intensity data may also occur before data is provided. For example, to correct the at least one signal intensity datum, at least one excitation pulse that homogenizes the signal intensity data may be used. This excitation pulse or this excitation pulse sequence is configured such that the sensitivity of the coil arrangement is taken into account when receiving. The pulse is thus optimized for a specific measurement arrangement.

In one embodiment, a spoke pulse sequence may be used as a high frequency pulse. A spoke pulse sequence is a term for certain pulses that mitigate the B1+ inhomogeneity (see Zelinski et al.: Fast Slice-Selective Radio-Frequency Excitation Pulses for Mitigating B1+ Inhomogeneity in the Human Brain at 7 Tesla, MRM 59 (6), pp. 1355-1364, 2008).

In one embodiment, a shim-signal that homogenizes the signal intensity data may be used for correcting the at least one signal intensity datum. The correction may be not only coil-related, but additionally or alternatively may be carried out in a patient-related or sample-related manner. Then, the receiver characteristics may be used to improve the shim such that the measured values have homogenized signal intensities. This relates to the processed state of the measured values. Due to the improved shim, the values in the image, in the CSI, or in the localized spectrum are therefore homogenized.

A filter may be used to correct at least one signal intensity datum. A filter may also be known as a correction map. The filter therefore contains location-related correction information. For example, the filter may be an image with the same resolution as a processed image of a patient. The values contained in the filter are then multiplied on a pixel-by-pixel basis by the processed patient image in order to obtain a corrected patient image.

For example, a resolution-dependent filter may be used. A dedicated filter may therefore be used in each case for the usual resolutions found in two-dimensional MR images (e.g., 128×128, 256×256 or 512×512). This makes it possible to avoid problems that may occur when adjusting the resolution of the filter.

In one embodiment, the method may be used for correcting a magnetic resonance image dataset (e.g., a magnetic resonance image dataset that depicts a breast region). Specifically, fluctuations in signal intensity that make the diagnosis more difficult may occur in the images.

As already disclosed, one or a plurality of coils may be used when transmitting and for receiving. In the simplest scenario, only one coil is used for transmission and for receiving. It is also possible, however, to use a transmission coil and a separate receiver coil. The transmission coil and/or the receiver coil may also be configured as a coil array. In one or more of the present embodiments, the terms transmission coil and receiver coil are used for the respective transmission or receiver coil or coil arrangement without having to be separate coils.

A coil arrangement is understood as all types of coil designs that have been disclosed. The receiver coil arrangement likewise denotes all coil arrangements that have been disclosed in the case of receiving. This therefore also includes a single coil that is also the transmission coil.

In one embodiment, a CP coil arrangement may be used as a coil arrangement. A CP coil arrangement is a coil arrangement that emits waves that are polarized in a circular manner.

In one embodiment, the coil arrangement may include a transmission coil arrangement and a separate receiver coil arrangement. The receiver coil arrangement may be embodied as a coil array. Parallel imaging may be carried out with this.

One or more of the present embodiments also relate to a data carrier for a control apparatus for controlling a data-generation unit of a magnetic resonance system with data for carrying out the method described. Advantageously, the data-generation unit may be an image generation unit.

One or more of the present embodiments also relate to a magnetic resonance system with a control apparatus. The magnetic resonance system is characterized by the fact that the control apparatus is embodied to carry out the method as described.

To avoid repetition, reference is made to the fact that advantageous developments of the magnetic resonance system will emerge from the developments of the method that is described.

DETAILED DESCRIPTION

Figure 1:
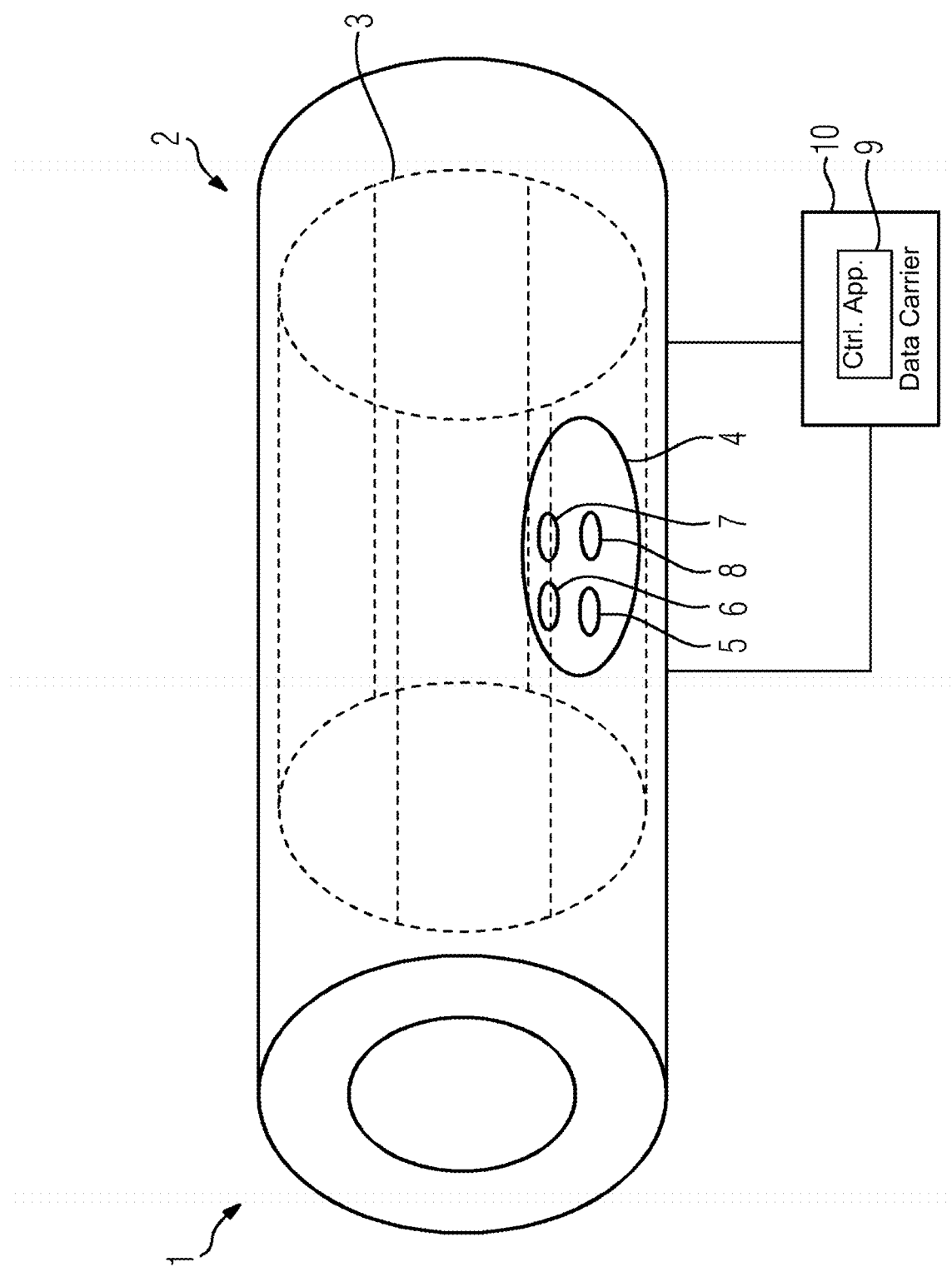
FIG. 1 shows a magnetic resonance device.

FIG. 1 shows a magnetic resonance system 1. The magnetic resonance system 1 has a coil arrangement 2 with a transmission coil 3 embodied as a body coil. The coil arrangement 2 further includes a receiver coil arrangement. The receiver coil arrangement is a coil array 4 with coils 5, 6, 7 and 8. For example, the coil array 4 may be embodied as a breast coil arrangement. For improved differentiation, the transmission coil 3 is shown with a dotted line. A control apparatus 9 is provided for controlling the magnetic resonance system 1.

The magnetic resonance system 1 further includes a data carrier 10 as part of the control apparatus 9 or independent thereof, on which data carrier computer programs to carry out magnetic resonance measurements are stored.

The transmission coil 3 is used to generate $B_1^+$ fields in order to excite magnetization in the examination subject (e.g., to achieve a desired flip angle).

The coil array 4 is used only for reading the measurement signal. The coils 5, 6, 7 and 8 of the coil array 4 read the measurement signal at the same time. Instead of the coil array 4, a single coil may also be used as a detection coil.

Further components of the magnetic resonance system 1, such as gradient coils or the patient couch, are not shown for reasons of clarity.

Figure 2:
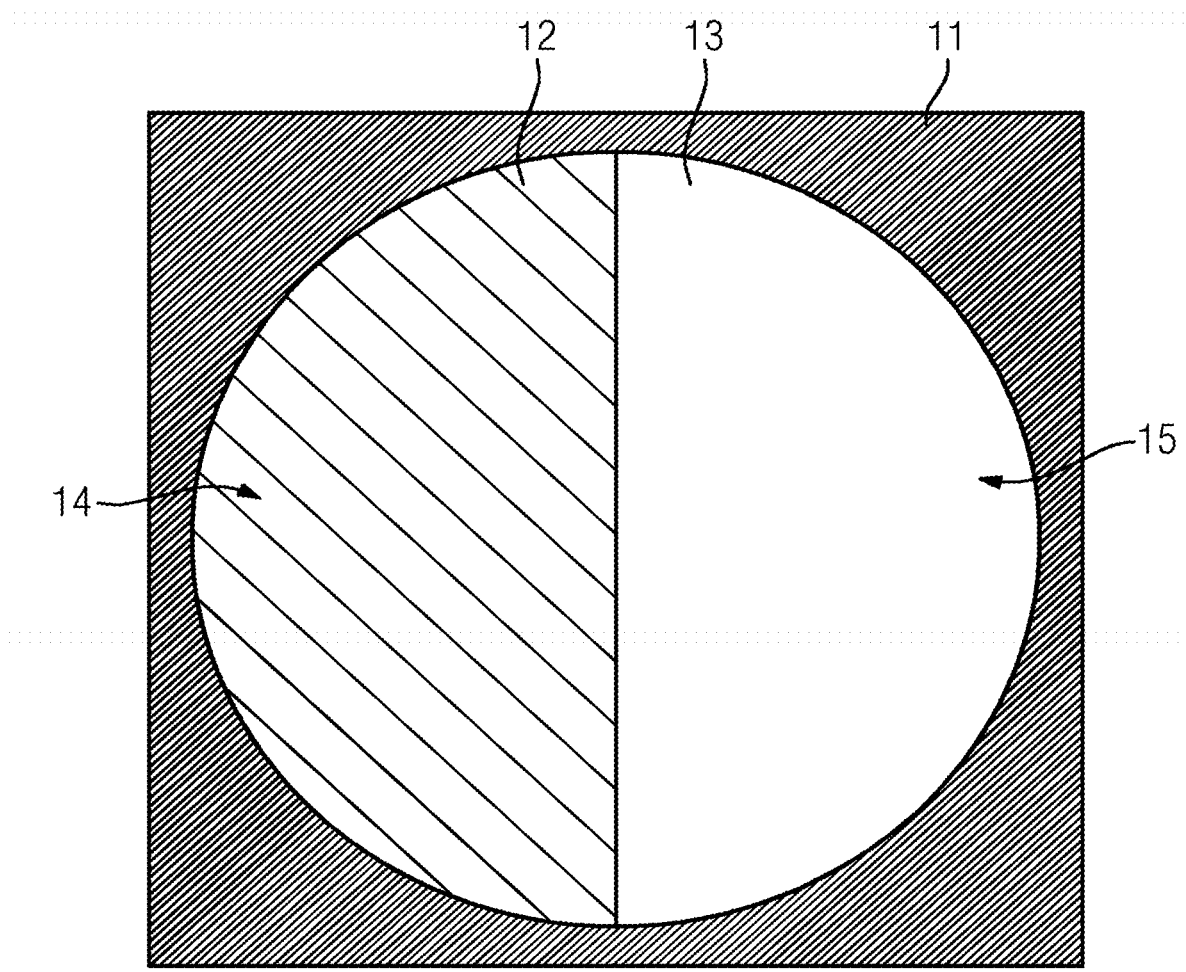
FIG. 2 shows a $B_1^-$ map.

FIG. 2 shows an image dataset 11 that depicts a $B_1^-$ map 12 of a phantom 13. Purely by way of example, the $B_1^-$ map 12 has a first region 14 and a second region 15 with different values. The $B_1^-$ values are lower in the first region 14 than in the second region 15.

Figure 3:
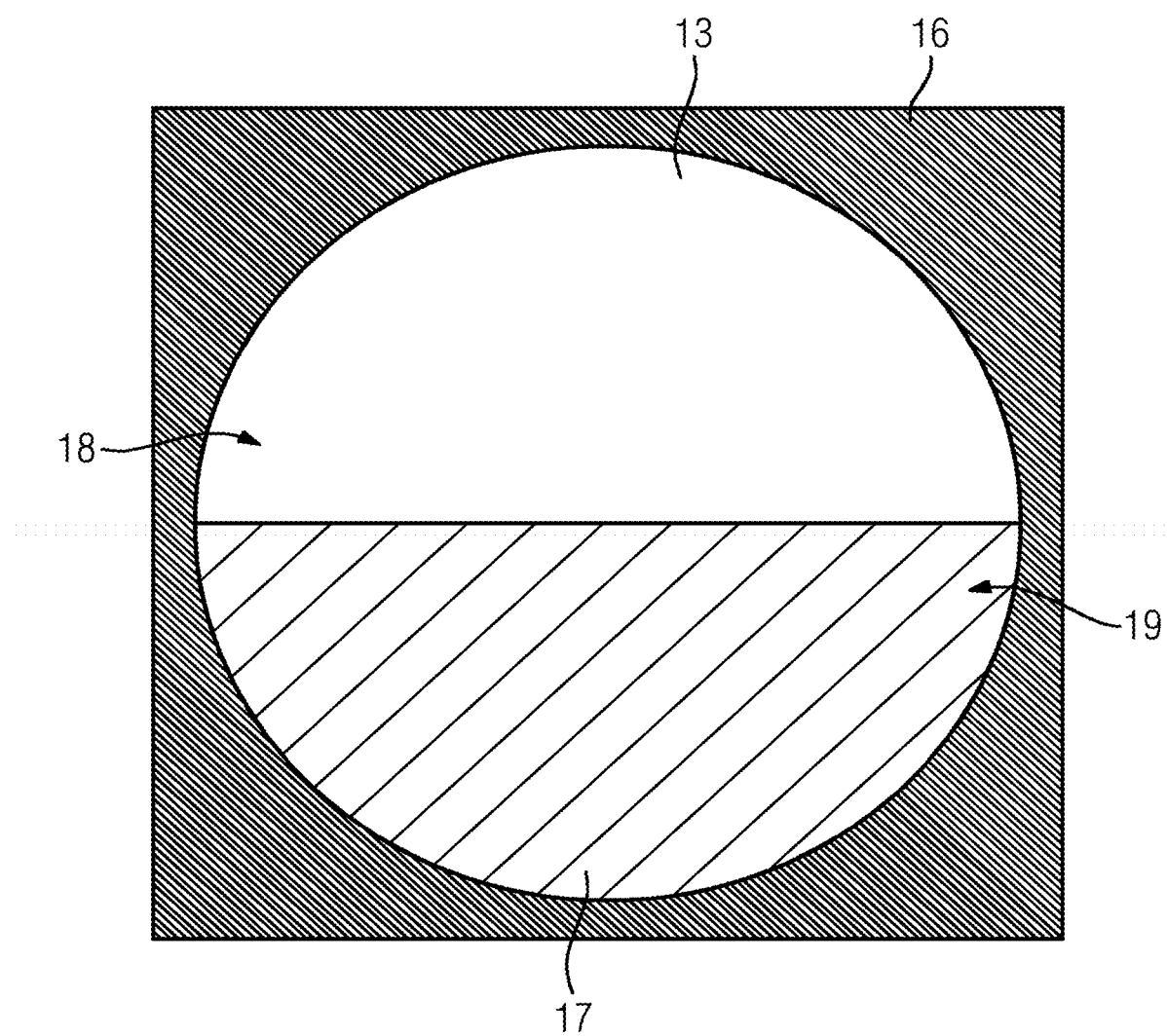
FIG. 3 shows a $B_1^+$ map.

FIG. 3 shows an image dataset 16 that depicts a $B_1^+$ map 17 of the phantom 13. The $B_1^+$ map 17 likewise has a first region 18 and a second region 19 with different values, purely by way of example. The $B_1^+$ values are higher in the first region 18 than in the second region 19.

Figure 4:
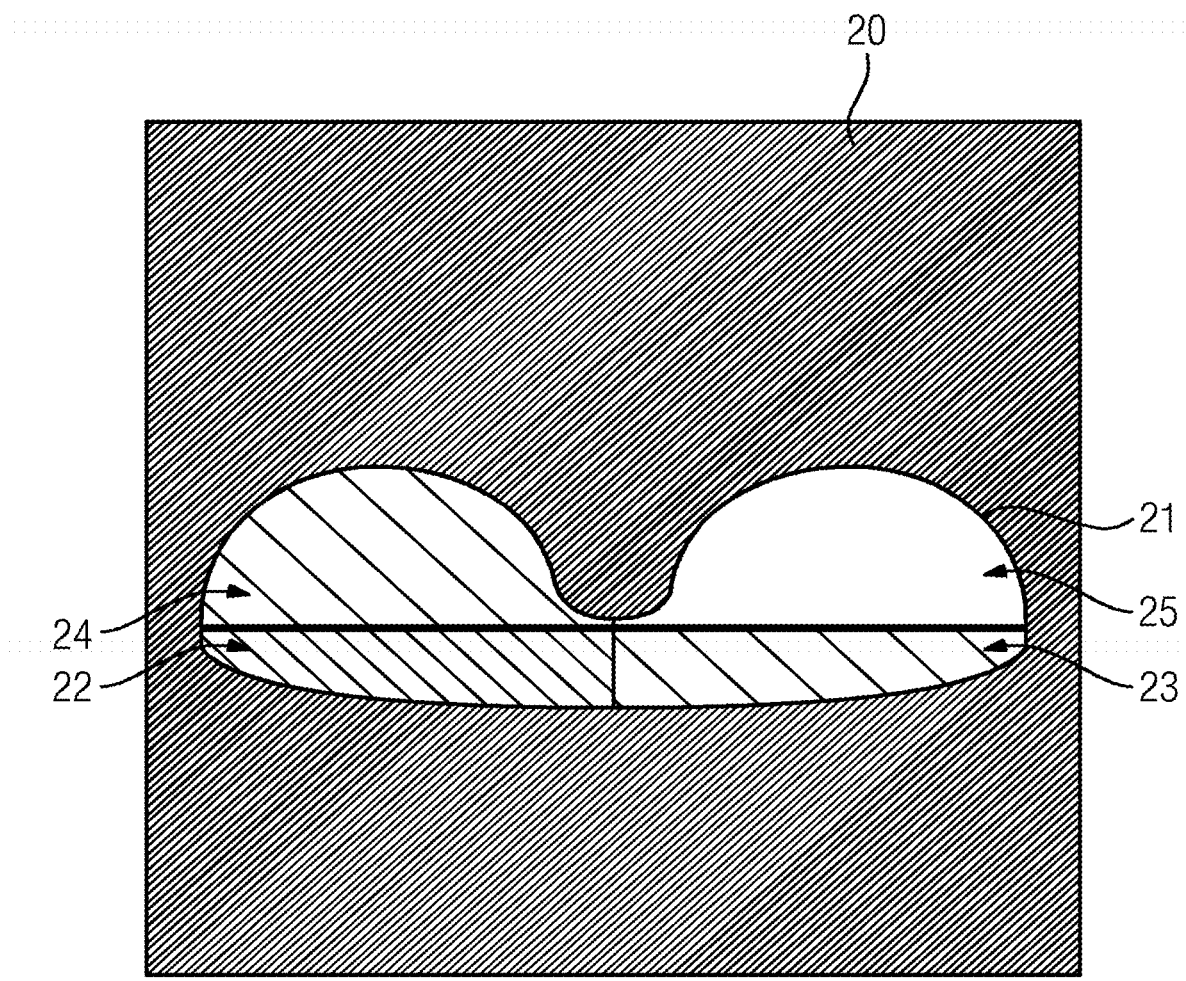
FIG. 4 shows an image dataset in a first embodiment.

FIG. 4 shows an image dataset 20 that depicts a cross section of the breast of a patient 21. This cross section was recorded using the transmission and receiving characteristics shown in FIGS. 2 and 3. The first region 22, the second region 23, the third region 24, and the fourth region 25 have different signal intensity values, as no kind of correction has been made.

The differences in signal intensity between regions 22 and 23 and regions 24 and 25 may be reduced by an optimized HF pulse. This is intended to reduce the $B_1^+$ differences.

Figure 5:
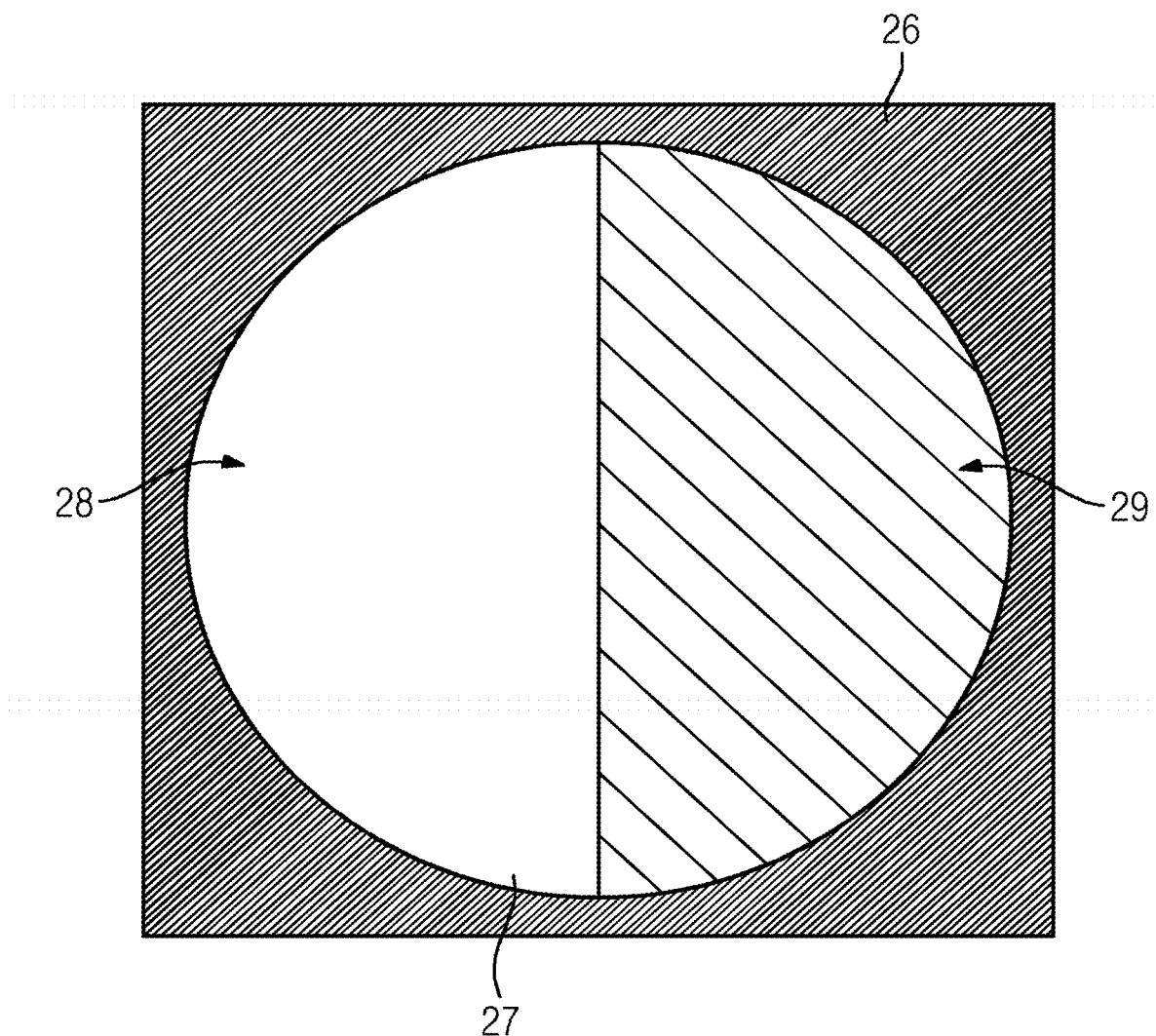
FIG. 5 shows a filter.

In order to likewise reduce the differences in signal intensity between regions 22 and 24 and regions 23 and 25, a plurality of options are available:

First, a filter 26, as shown in FIG. 5, may be calculated from the $B_1^-$ map 12. The image dataset 27 with the filter 26 has two regions 28 and 29 that complement the $B_1^-$ map 12. If the values in the $B_1^-$ map 12 and in the filter 26 are multiplied on a pixel-by-pixel basis, the result is always the same value. In other words, the filter 26 is configured to obtain correction values with which the signal intensities are homogenized. Each pixel represents one correction datum.

Second, an HF pulse that has been optimized not only with respect to the $B_1^+$ field but also with regard to location-dependent sensitivities of the coil array 4 (e.g., of the receiver coil arrangement) may be generated. Then, a filter may be created in addition. If the HF pulse is adequate, then a filter is no longer needed.

Third, a correction shim signal may be calculated as a function of a $B_1^-$ map recorded with the patient. The aforementioned correction measures may all be used in isolation or in any combination.

In one embodiment, all three options are carried out in a patient-specific and coil-specific manner. Since the artifacts happen to be patient-dependent, it is not sufficient to carry out a phantom measurement for a specific coil arrangement. The calculation of the $B_1^-$ map and the corrections that are to be carried out are therefore done individually for each patient. Where necessary, a plurality of $B_1^-$ maps may be determined for different slices, or in the case of movements, by the patient.

Figure 6:
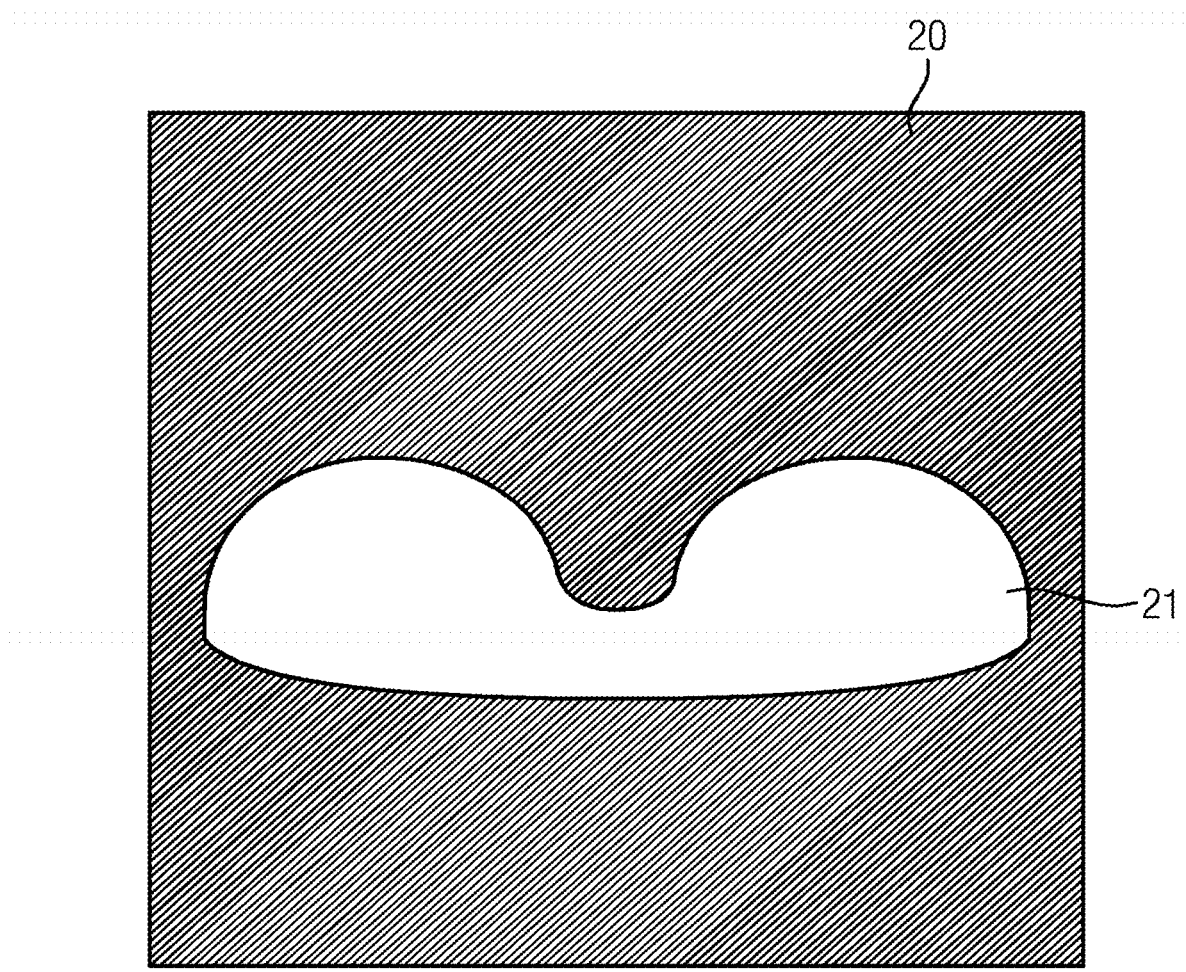
FIG. 6 shows an image data set in a second embodiment.

FIG. 6 shows the image dataset 20, in which the measurement has taken place with an optimized excitation pulse and the processed measured values have been corrected with the filter 26. The image dataset 20 has homogeneous values or signal intensities.

Figure 7:
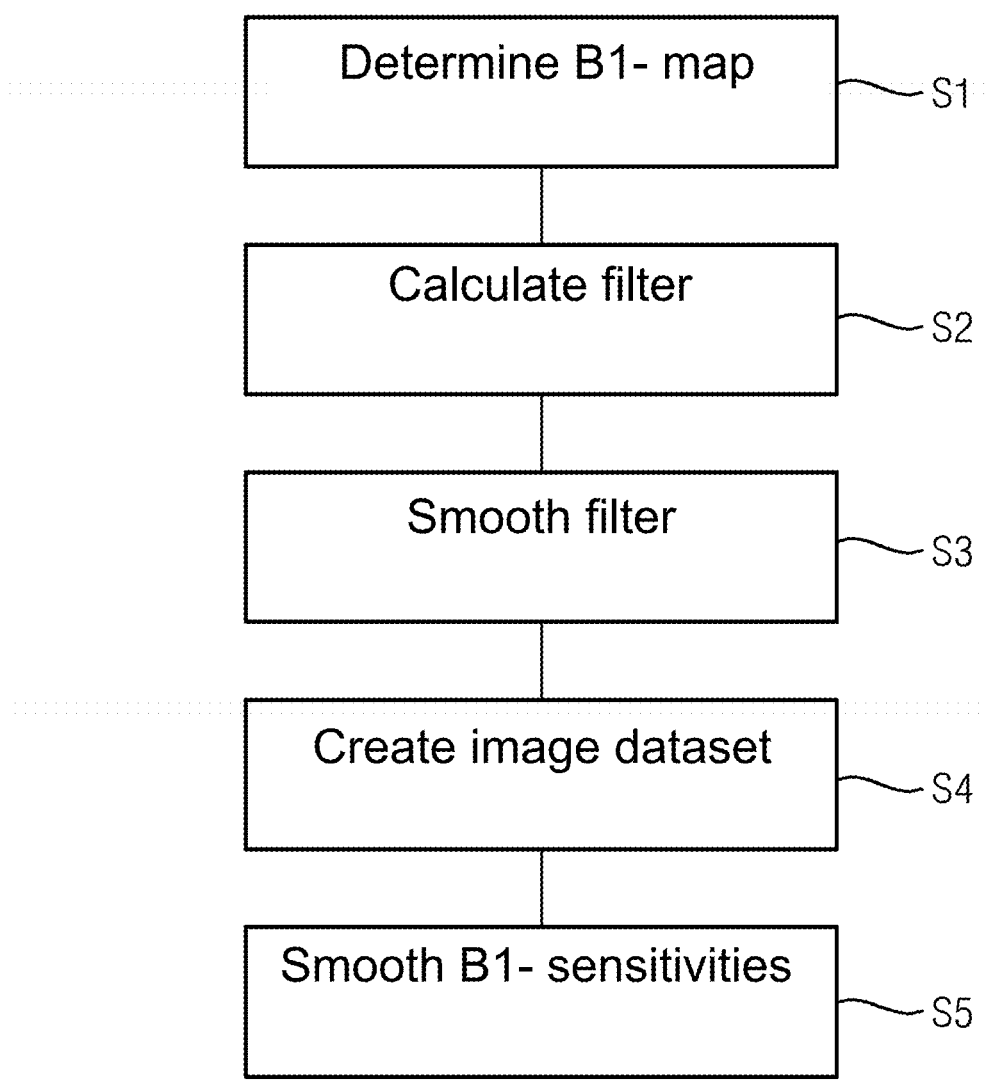
FIG. 7 shows a first flow chart for operating a magnetic resonance system.

FIG. 7 shows a first flow chart for generating a spatially resolved magnetic resonance dataset. In act S1, a $B_1^-$ map 12 is determined using a coil arrangement 2; relevant methods have been defined in the aforementioned. A plurality of maps 12 with different resolutions may also be obtained.

In act S2, a filter 26 is calculated from the $B_1^-$ map 12. The filter 26 may be smoothed out in act S3 by, for example, calculating a mean value in each case from adjacent values.

In act S4, a magnetic resonance dataset is recorded and processed to create an image dataset 20. Any optional post-processing steps may be carried out as desired.

As a result of the values in the image dataset 20 being multiplied on a pixel-by-pixel basis by the filter 26, in act S5, different $B_1^-$ sensitivities of the coil arrangement 2 may be smoothed out. Different $B_1^-$ sensitivities provide location-dependent $B_1^-$ sensitivities.

Figure 8:
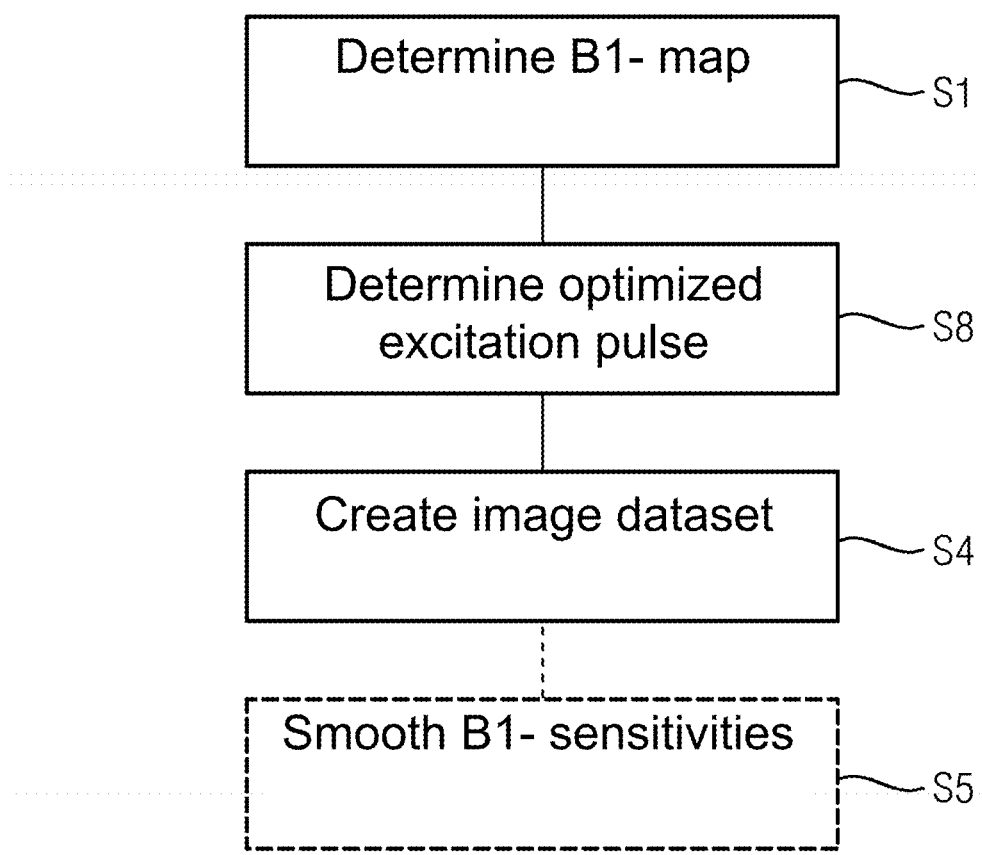
FIG. 8 shows a second flow chart for operating a magnetic resonance system.

FIG. 8 shows a different option for smoothing out different $B_1^-$ sensitivities in a coil arrangement.

After a $B_1^-$ map 12 has been recorded, the $B_1^-$ map 12 is used in act S8 to determine an optimized excitation pulse. In the best-case scenario, the different $B_1^-$ sensitivities are already taken into account by the optimized excitation pulse such that, with act S4, an image dataset 20 with homogeneous signal intensities is already available. As has already been stressed, this provides that differences in signal intensity due to different $B_1^-$ sensitivities of the coil arrangement 2 have been reduced or eliminated. Act S5 may therefore be omitted depending on the quality that is achieved for the excitation pulse.

The excitation pulse is intended to refer to all high frequency pulses that are relevant to the $B_1^-$ sensitivity until data is recorded. Therefore, in the case of a spin echo, for example, the excitation pulse alone, the refocusing pulse alone, or the excitation pulse and the refocusing pulse may be modified so that the different $B_1^-$ sensitivities are smoothed out. Therefore, not necessarily all the high frequency pulses have to be modified.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for generating a spatially resolved magnetic resonance dataset using a coil arrangement, the method comprising:
   providing at least one correction datum based on receiver characteristics of the coil arrangement;
   providing a magnetic resonance dataset with spatially resolved signal intensity data; and
   correcting the spatially resolved signal intensity data in the magnetic resonance dataset using the at least one correction datum before or after providing the magnetic resonance dataset,
   wherein correcting the spatially resolved signal intensity data comprises correcting the spatially resolved signal intensity data using an excitation pulse that homogenizes the signal intensity data.

2. The method of claim 1, further comprising measuring at least one item of B1 receiving information relating to the coil arrangement to acquire the at least one correction datum.

3. The method of claim 1, further comprising recording at least one B1 receiving map relating to the coil arrangement to acquire the at least one correction datum.

4. The method of claim 1, further comprising determining at least one item of B1+ transmission information relating to the coil arrangement to acquire the at least one correction datum.

5. The method of claim 1, further comprising recording at least one Bi+ transmission map to acquire the at least one correction datum.

6. The method of claim 1, wherein the excitation pulse is a spoke pulse.

7. The method of claim 1, wherein correcting the spatially resolved signal intensity data comprises correcting the spatially resolved signal intensity data using a shim signal that homogenizes the signal intensity data.

8. The method of claim 1, wherein correcting the spatially resolved signal intensity data comprises correcting the spatially resolved signal intensity data using a filter.

9. The method of claim 1, wherein the magnetic resonance data set is a magnetic resonance image data set that depicts a breast region.

10. The method of claim 1, wherein the coil arrangement comprises a circular-polarized coil arrangement.

11. The method of claim 1, wherein the coil arrangement includes a transmission coil arrangement and a separate receiver coil arrangement.

12. A non-transitory computer-readable storage medium that stores instructions executable by a controller to control a data-generation unit of a magnetic resonance system, the instructions comprising:
   providing at least one correction datum based on receiver characteristics of a coil arrangement;
   providing a magnetic resonance dataset with spatially resolved signal intensity data; and
   correcting the spatially resolved signal intensity data in the magnetic resonance dataset using the at least one correction datum before or after providing the magnetic resonance dataset,
   wherein correcting the spatially resolved signal intensity data comprises correcting the spatially resolved signal intensity data using an excitation pulse that homogenizes the signal intensity data.

13. The non-transitory computer-readable storage medium of claim 12, wherein the data-generation unit comprises an image generation unit.

14. The non-transitory computer-readable storage medium of claim 12, wherein the instructions further comprise measuring at least one item of B1 receiving information relating to the coil arrangement to acquire the at least one correction datum.

15. The non-transitory computer-readable storage medium of claim 12, wherein the instructions further comprise recording at least one B1 receiving map relating to the coil arrangement to acquire the at least one correction datum.

16. The non-transitory computer-readable storage medium of claim 12, wherein the instructions further comprise determining at least one item of B1+ transmission information relating to the coil arrangement to acquire the at least one correction datum.

17. A magnetic resonance system comprising:
   a controller configured to generate a spatially resolved magnetic resonance dataset using a coil arrangement, the generation comprising:
      provision of at least one correction datum based on receiver characteristics of the coil arrangement;
      provision of a magnetic resonance dataset with spatially resolved signal intensity data; and
      correction of the spatially resolved signal intensity data in the magnetic resonance dataset using the at least one correction datum before or after the provision of the magnetic resonance dataset,
   wherein correction of the spatially resolved signal intensity data comprises correction of the spatially resolved signal intensity data using an excitation pulse that homogenizes the signal intensity data.

* * * * *